(12) United States Patent
Asano

(10) Patent No.: US 11,316,073 B2
(45) Date of Patent: Apr. 26, 2022

(54) SEMICONDUCTOR LIGHT EMITTING DEVICE AND METHOD OF MANUFACTURING SEMICONDUCTOR LIGHT EMITTING DEVICE

(71) Applicant: Nikkiso Co., Ltd, Tokyo (JP)

(72) Inventor: Hideki Asano, Ishikawa (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/249,302

(22) Filed: Jan. 16, 2019

(65) Prior Publication Data
US 2019/0221715 A1 Jul. 18, 2019

(30) Foreign Application Priority Data
Jan. 16, 2018 (JP) .............................. JP2018-004953

(51) Int. Cl.
*H01L 33/44* (2010.01)
*H01L 23/00* (2006.01)
(52) U.S. Cl.
CPC ............ *H01L 33/44* (2013.01); *H01L 23/562* (2013.01); *H01L 2933/0025* (2013.01)
(58) Field of Classification Search
CPC .............................. H01L 23/562; H01L 33/44
See application file for complete search history.

(56) References Cited

U.S. PATENT DOCUMENTS

| | | | | |
|---|---|---|---|---|
| 8,115,866 B2* | 2/2012 | Capps | ..................... | H04N 7/012 348/448 |
| 2009/0296369 A1* | 12/2009 | Xu | ........................ | H01L 33/508 362/84 |
| 2012/0068208 A1* | 3/2012 | Tseng | ..................... | H01L 33/505 257/98 |
| 2013/0033678 A1* | 2/2013 | Natsumeda | ............ | G02B 6/005 353/20 |
| 2015/0014030 A1* | 1/2015 | Mitamura | ............... | B32B 15/08 174/257 |
| 2015/0021549 A1* | 1/2015 | Zhang | ..................... | H01L 33/06 257/13 |
| 2016/0211425 A1* | 7/2016 | Tsujimoto | ............... | H01L 33/22 |
| 2016/0308089 A1* | 10/2016 | Kim | ......................... | H01L 33/54 |
| 2018/0277723 A1* | 9/2018 | Hirano | .................... | H01L 33/20 |
| 2019/0013443 A1* | 1/2019 | Nakabayashi | .......... | H01L 33/44 |

FOREIGN PATENT DOCUMENTS

| | | |
|---|---|---|
| JP | 2008066557 (A) | 3/2008 |
| JP | 2009111102 A | 5/2009 |
| JP | 2017120837 A | 7/2017 |
| WO | WO-2017/072859 A1 | 5/2017 |

OTHER PUBLICATIONS

Office Action dated Jun. 29, 2021 in JP Application No. 2018-004953, 5 pages.

* cited by examiner

*Primary Examiner* — Christine A Enad
(74) *Attorney, Agent, or Firm* — Muncy, Geissler, Olds & Lowe, P.C.

(57) ABSTRACT

A semiconductor light emitting device includes: a light emitting part for emitting ultraviolet light; and a coating part that coats a part of an extraction surface from which the ultraviolet light emitted by the light emitting part is extracted. The coating part is comprised of a plurality of isolated parts distanced from each other, and the isolated part is made of a second material having a refractive index that is lower than a refractive index of a first material forming the extraction surface.

9 Claims, 4 Drawing Sheets

SEMICONDUCTOR LIGHT EMITTING DEVICE AND METHOD OF MANUFACTURING SEMICONDUCTOR LIGHT EMITTING DEVICE

CROSS-REFERENCE TO RELATED APPLICATIONS

This application is based upon and claims the benefit of priority from the prior Japanese Patent Application No. 2018-4953, filed on Jan. 16, 2018, the entire contents of which are incorporated herein by reference.

BACKGROUND OF THE INVENTION

1. Field of the Invention

The present invention relates to a semiconductor light emitting device and a method of manufacturing a semiconductor light emitting device.

2. Description of the Related Art

Recently, efforts have been made to develop semiconductor light emitting devices capable of emitting ultraviolet light having a short wavelength. A semiconductor light emitting device for ultraviolet light like this is configured such that layers such as an n-type layer, an active layer, and a p-type layer each comprised of a nitride-based semiconductor layer are stacked on a substrate in a predetermined order. In a semiconductor light emitting device like this, ultraviolet light emitted by the active layer need be extracted outside via the substrate or the semiconductor layers. However, because the refractive index of ordinary nitride-based semiconductor layers is significantly greater than that of air and because ultraviolet light is absorbed significantly by some of the nitride-based materials (e.g., gallium nitride) forming the semiconductor layers, it is difficult to improve the efficiency of extracting light absent any extra measures.

In this background, attempts have been made to reduce the internal reflection caused by a difference in refractive index across the light emitting surface by sealing the light emitting surface of the semiconductor light emitting device with a resin having a higher refractive index than air. There is also known a semiconductor light emitting device in which micro concave-convex shapes are formed on the light emitting surface to reduce the internal reflection on the light emitting surface (see patent document 1). [patent document 1] JP2008-66557

As described above, the internal reflection on the light emitting surface is reduced and the efficiency of extracting light is improved by coating the light emitting surface of the semiconductor light emitting device with a resin. While resin is durable against ultraviolet light, the resin coating may be cracked or exfoliated from the light emitting surface due to various causes such as a temperature cycle associated with the on and off the light emitting devices, absorption of ultraviolet light, and residual stress inside the resin. Further improvement is therefore called for from the perspective of durability and reliability.

SUMMARY OF THE INVENTION

In this background, one illustrative purpose of the present invention is to provide a technology of further improving the durability and reliability of a semiconductor light emitting device for emitting ultraviolet light.

A semiconductor light emitting device according to an embodiment includes: a light emitting part for emitting ultraviolet light; and a coating part that coats a part of an extraction surface from which the ultraviolet light emitted by the light emitting part is extracted. The coating part is comprised of a plurality of isolated parts distanced from each other, and the isolated part is made of a second material having a refractive index that is lower than a refractive index of a first material forming the extraction surface.

Optional combinations of the aforementioned constituting elements, and implementations of the invention in the form of methods, apparatuses, and systems may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
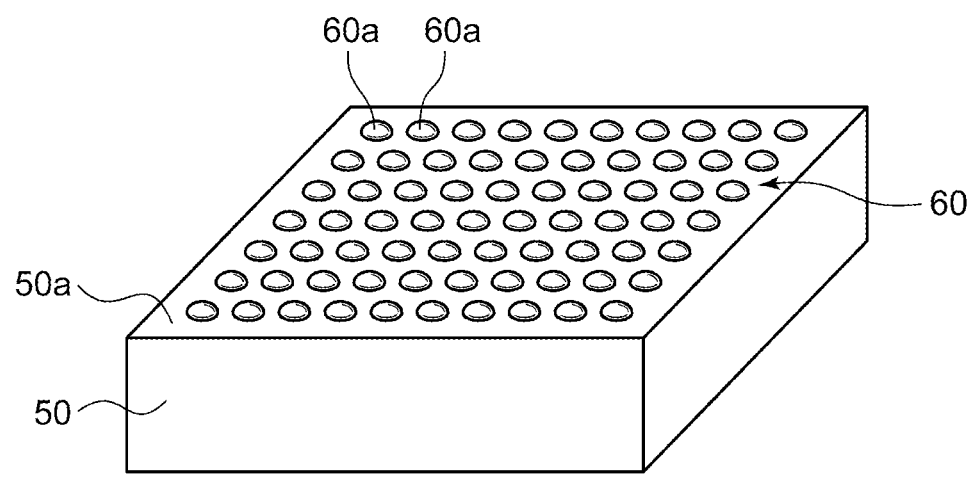
FIG. 1 is a perspective view showing a schematic configuration of a semiconductor light emitting device according to an embodiment.

The invention will now be described by reference to the preferred embodiments. This does not intend to limit the scope of the present invention, but to exemplify the invention.

A semiconductor light emitting device according to an embodiment includes: a light emitting part for emitting ultraviolet light; and a coating part that coats a part of an extraction surface from which the ultraviolet light emitted by the light emitting part is extracted. The coating part is comprised of a plurality of isolated parts distanced from each other, and the isolated part is made of a second material having a refractive index that is lower than a refractive index of a first material forming the extraction surface.

Generally, many of materials that form a light emitting part for emitting ultraviolet light have a larger refractive index than air. Therefore, exposure of a light emitting surface to air increases ultraviolet light that is internally reflected in the light emitting part and reduces the efficiency of extracting light. Thus, according to this embodiment, at least a difference in refractive index at an interface between the extraction surface and the coating part is reduced, and the efficiency of extracting light is improved. Since the coating part is comprised of a plurality of isolated parts distanced from each other, the residual stress inside each isolated part is reduced accordingly. As a result, the tensile stress and compression stress produced at an interface between the extraction surface and the coating part is mitigated, and the occurrence of exfoliation and cracks of the coating part at the interface is reduced.

The plurality of isolated parts may be arranged in a dot pattern. This allows the isolated parts to be arranged in a systematically distributed pattern.

A diameter or one side of the isolated part may be not less than 1 μm and not more than 100 μm. This allows the isolated part to be formed by a relatively simple method such as printing.

The second material may be an amorphous fully fluorinated resin having saturation binding only. This improves durability against ultraviolet light.

The second material may be a resin material having an ultraviolet transmittance of 80% or higher. This realizes a highly-efficient semiconductor light emitting device.

The first material may be a sapphire substrate or an aluminum nitride substrate.

A percentage of the extraction surface not coated with the coating part may be 10~90%.

Another embodiment relates to a method of manufacturing a semiconductor light emitting device. The method includes preparing a light emitting part for emitting ultraviolet light; and printing a coating part on an extraction surface from which the ultraviolet light emitted by the light emitting part is extracted. The coating part is comprised of a plurality of isolated parts distanced from each other, and the isolated part is made of a resin material having a refractive index that is lower than a refractive index of a substrate material forming the extraction surface.

Thus, according to this embodiment, at least a difference in refractive index at an interface between the extraction surface and the coating part is reduced, and the efficiency of extracting light is improved. Since the coating part is comprised of a plurality of isolated parts distanced from each other, the residual stress inside each isolated part is reduced accordingly. As a result, the tensile stress and compression stress produced at an interface between the extraction surface and the coating part is mitigated, and a semiconductor light emitting device, in which the occurrence of exfoliation and cracks of the coating part at the interface is reduced, can be manufactured.

A description will be given of an embodiment of the present invention with reference to the drawings. In the explanations of the figures, the same elements shall be denoted by the same reference numerals, and duplicative explanations will be omitted appropriately. The configuration described below is by way of example only and does not limit the scope of the present invention.

As described above, it is possible to reduce the internal reflection due to a difference in refractive index across the light emitting surface, by sealing the light emitting surface of a semiconductor light emitting device with a resin having a higher refractive index than air. However, resin is poorer than glass or ceramics in terms of durability against light. In the case of semiconductor light emitting devices for emitting ultraviolet light, availability of resins that are durable against ultraviolet light is particularly limited.

Figure 5:
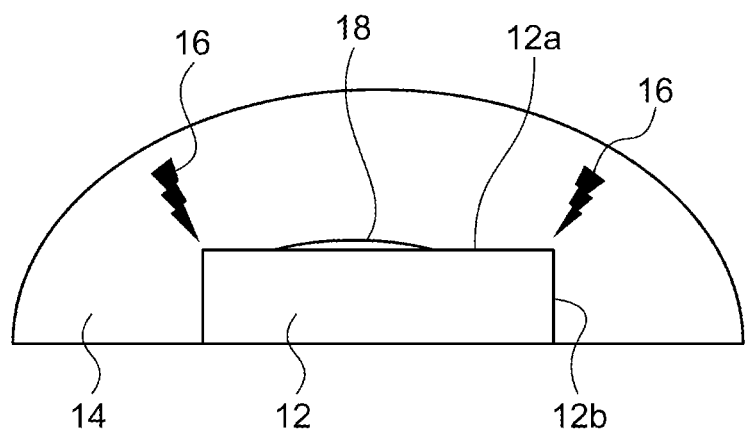
FIG. 5 is a schematic diagram illustrating a phenomenon that affects the durability when the entirety of the semiconductor light emitting device is sealed with a resin.

FIG. 5 is a schematic diagram illustrating a phenomenon that affects the durability when the entirety of the semiconductor light emitting device is sealed with a resin.

The semiconductor light emitting device 10 shown in FIG. 5 includes a light emitting part 12 for emitting ultraviolet light and a sealing resin 14 that coats and seals an extraction surface 12a and a side surface 12b from which the ultraviolet light produced inside the light emitting part 12 is extracted. The extraction surface 12a of the light emitting part 12 is a square of about 0.5~3 mm on one side. For example, the extraction surface 12a is formed by a transparent ceramic substrate made of sapphire or aluminum nitride. A substrate like this has a significantly high refractive index (1.8~2.4). Therefore, improvement in the efficiency of extracting light is attempted by coating the extraction surface 12a with a sealing resin having a refractive index between the refractive index of the substrate and the refractive index of air.

However, fluororesin and silicone-based resin, which are highly durable against ultraviolet light, have a linear expansion coefficient that is larger than that of a ceramic substrate by an order of magnitude. Therefore, if the sealing resin 14 is subject to potting to coat the light emitting part 12 and then heated and cured, and if the temperature is lowered to the usage environment temperature, stress will remain inside the sealing resin 14.

For example, the linear expansion coefficient of CytopS (registered trademark) from AGC Inc., which is one of fluororesins that are highly durable against ultraviolet light, is $7.4 \times 10^{-5}/°$ C., and the linear expansion coefficient of a sapphire substrate is $7.0 \times 10^{-6}/°$ C. Given that the thermal curing temperature is 180° C., the usage environment temperature is 30° C., and the Young's modulus of CytopS is about 2 GPa, a rough calculation of the internal stress shows the following value.

$$(7.4 \times 10^{-5} - 7.0 \times 10^{-6})[1/° C.] \times (180-30)[° C.] \times 2 [GPa] \approx 2[kg/mm^2]$$

Thus, a residual stress of 2 kg per 1 mm² will be produced at the interface between the sapphire substrate and fluororesin in the process of lowering the temperature to the usage environment temperature after thermal curing. Moreover, the stress is proportional to the thickness of the sealing resin 14 and will be significantly large if the light emitting part 12 is sealed in a semispherical form as shown in FIG. 5. Thus, a crack 16 could easily occur at a corner of the light emitting part 12 where the stress is easily concentrated due to the shape. Further, an exfoliation 18 may be created between the substrate and the resin at the central part of the extraction surface 12a of the light emitting part 12 where the ultraviolet output intensity is particularly high. A phenomenon like this is pronounced when the linear expansion coefficient of the coating part differs greatly from the linear expansion coefficient of the material of the extraction surface, but the countermeasure as described below will be useful in the presence of any slight difference of the linear expansion coefficient of the coating part from the linear expansion coefficient of the material of the extraction surface (for example, the linear expansion coefficient of the coating that is twice or more that of the linear expansion coefficient of the substrate).

It is therefore revealed that, by coating the extraction surface of the light emitting part with a material having a refractive index lower than that of the light emitting part, the efficiency of extracting light is improved, but, on the other hand, the residual stress inside the material of a low refractive index affects the durability.

In this background, we have arrived, based on the above knowledge, at an idea of improving the durability and reliability of a semiconductor light emitting device by reducing the residual stress inside a material of a low refractive index. To describe it more specifically, we arrived at an idea of inhibiting cracks and exfoliation by reducing the size of a material of a low refractive index that coats the extracting surface of the light emitting part and distributing the stress accordingly.

Figure 2:
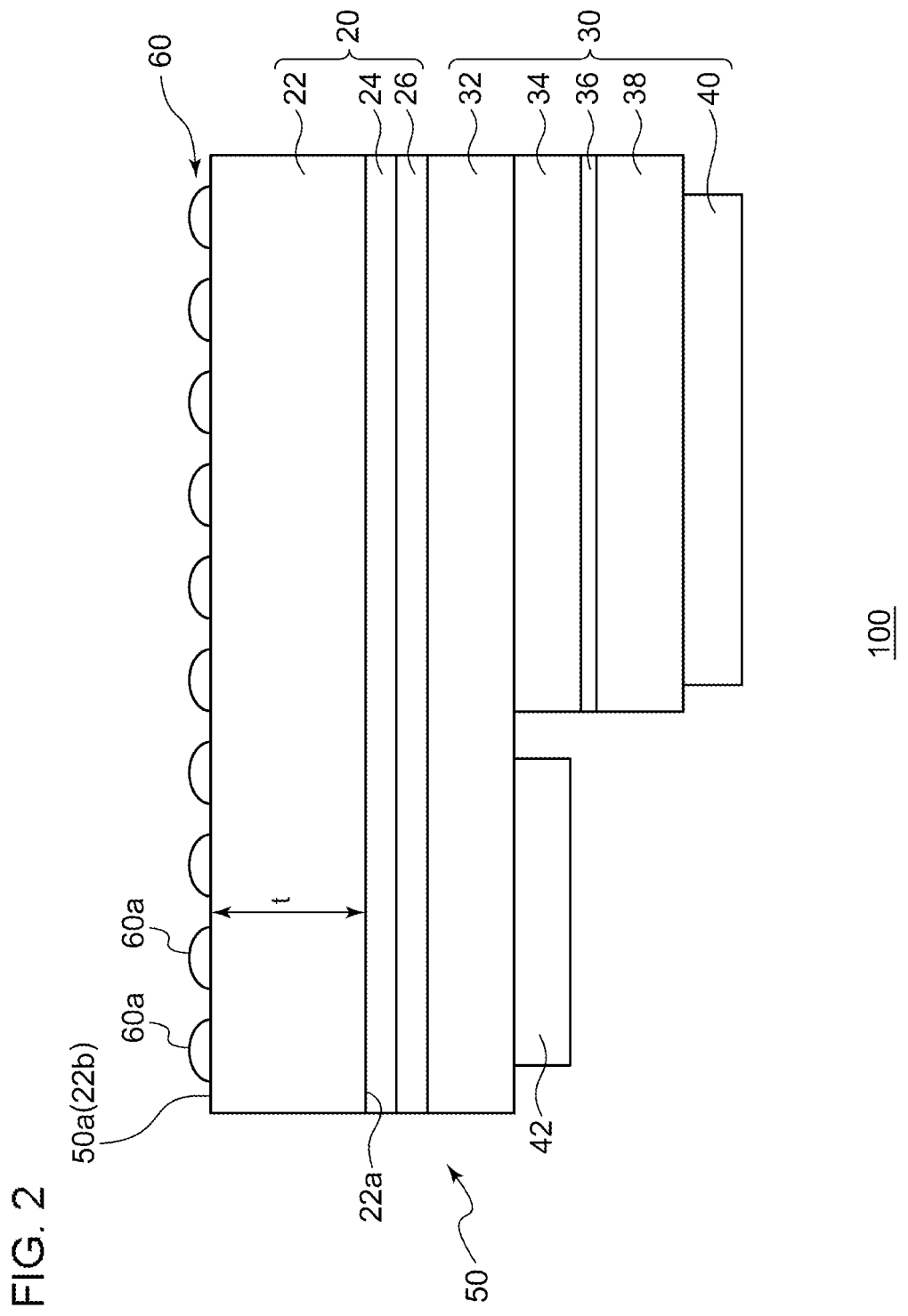
FIG. 2 is a cross-sectional view schematically showing a configuration of the semiconductor light emitting device according to the embodiment.

FIG. 1 is a perspective view showing a schematic configuration of a semiconductor light emitting device 100 according to an embodiment. FIG. 2 is a cross-sectional view schematically showing a configuration of the semiconductor light emitting device according to the embodiment.

The semiconductor light emitting device 100 includes a light emitting part 50 for emitting ultraviolet light and a coating part 60 that coats a part of an extraction surface 50a from which the ultraviolet light emitted by the light emitting part 50 is extracted. The light emitting part 50 includes a base structure 20 and a light emitting structure 30. The base structure 20 includes a substrate 22, a first base layer 24, and a second base layer 26. The light emitting structure 30 includes an n-type clad layer 32, an active layer 34, an electron block layer 36, a p-type clad layer 38, a p-side electrode 40, and an n-side electrode 42.

The light emitting part 50 is configured to emit "deep ultraviolet light" having a central wavelength of about 365 nm or shorter. To output deep ultraviolet light having such a wavelength, the active layer 34 is made of an aluminum gallium nitride (AlGaN)-based semiconductor material having a band gap of about 3.4 eV or larger. In this embodiment, the case of emitting deep ultraviolet light having a central wavelength of about 310 nm or shorter is specifically discussed.

In this specification, the term "AlGaN-based semiconductor material" mainly refers to a semiconductor material containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0 \leq x+y \leq 1$, $0 \leq x \leq 1$, $0 \leq y \leq 1$). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The substrate 22 is a sapphire ($Al_2O_3$) substrate. The substrate 22 may be an aluminum nitride (AlN) substrate in one variation. The substrate 22 includes a first principal surface 22a and a second principal surface 22b opposite to the first principal surface 22a. The first principal surface 22a is a principal surface that is a crystal growth surface. For example, the first principal surface 22a is the (0001) plane of the sapphire substrate. The second principal surface 22b is a principal surface that embodies the extraction surface 50a from which ultraviolet light is extracted.

The substrate 22 has a thickness t of 1 μm or larger. For example, the substrate 22 has a thickness of about 5 μm, 10 μm, 100 μm, 300 μm, or 500 μm. The first base layer 24 and the second base layer 26 are stacked on the first principal surface 22a of the substrate 22. The first base layer 24 is a layer made of an AlN-based semiconductor material and is, for example, an AlN(HT-AlN) layer grown at a high temperature. The second base layer 26 is a layer made of an AlGaN-based semiconductor material and is, for example, an undoped AlGaN(u-AlGaN) layer.

The substrate 22, the first base layer 24, and the second base layer 26 function as a foundation layer (template) to form the n-type clad layer 32 and the layers above. These layers also function as a light extraction layer for extracting the deep ultraviolet light emitted by the active layer 34 outside and transmit the deep ultraviolet light emitted by the active layer 34. It is preferred that the first base layer 24 and the second base layer 26 be made of an AlGaN-based or AlN-based material having an AlN ratio higher than that of the active layer 34 so as to increase the transmittance for the deep ultraviolet light emitted by the active layer 34. It is further preferred that the first base layer 24 and the second base layer 26 be made of a material having a lower refractive index than the active layer 34.

It is also preferred that the first base layer 24 and the second base layer 26 be made of a material having a higher refractive index than the substrate 22. Given, for example, that the substrate 22 is a sapphire substrate (the refractive index $n_1$=about 1.8) and the active layer 34 is a made of an AlGaN-based semiconductor material (the refractive index $n_3$=about 2.4~2.6), it is preferred that the first base layer 24 and the second base layer 26 be made of an AlN layer (the refractive index $n_2$=about 2.1) or an AlGaN-based semiconductor material (the refractive index $n_2$=about 2.2~2.3) having a relatively higher AlN composition ratio.

The n-type clad layer 32 is an n-type semiconductor layer provided on the second base layer 26. The n-type clad layer 32 is made of an n-type AlGaN-based semiconductor material. For example, the n-type clad layer 32 is an AlGaN layer doped with silicon (Si) as an n-type impurity. The composition ratio of the n-type clad layer 32 is selected to transmit the deep ultraviolet light emitted by the active layer 34. For example, the n-type clad layer 32 is formed such that the molar fraction of AlN is 40% or higher, and, preferably, 50% or higher. The n-type clad layer 32 has a band gap larger than the wavelength of the deep ultraviolet light emitted by the active layer 34. For example, the n-type clad layer 32 is formed to have a band gap of 4.3 eV or larger. The n-type clad layer 32 has a thickness of about 1 μm~3 μm. For example, the n-type clad layer 32 has a thickness of about 2 μm.

The active layer 34 is formed in a partial region on the n-type clad layer 32. The active layer 34 is made of an AlGaN-based semiconductor material and has a double heterojunction structure by being sandwiched by the n-type clad layer 32 and the electron block layer 36. The active layer 34 may form a monolayer or multilayer quantum well structure. The quantum well structure like this can be formed by building a stack of a barrier layer made of an undoped AlGaN-based semiconductor material and a well layer made of an undoped AlGaN-based semiconductor material. To output deep ultraviolet light having a wavelength of 355 nm or shorter, the active layer 34 is formed to have a band gap of 3.4 eV or larger. For example, the AlN composition ratio of the active layer 34 is selected so as to output deep ultraviolet light having a wavelength of 310 nm or shorter.

The electron block layer 36 is formed on the active layer 34. The electron block layer 36 is a layer made of a p-type AlGaN-based semiconductor material and is exemplified by an undoped AlGaN layer. The electron block layer 36 is formed such that the molar fraction of AlN is 40% or higher, and, preferably, 50% or higher. The electron block layer 36 may be formed such that the molar fraction of AlN is 80% or higher or may be made of an AlN-based semiconductor material that does not substantially contain GaN. The electron block layer 36 may be made of an AlGaN-based semiconductor material or an AlN-based semiconductor material doped with magnesium (Mg) as a p-type impurity. The electron block layer 36 has a thickness of about 1 nm~10 nm. For example, the electron block layer 36 has a thickness of about 2 nm~5 nm.

The p-type clad layer 38 is formed on the electron block layer 36. The p-type clad layer 38 is a layer made of a p-type AlGaN-based semiconductor material and is exemplified by a Mg-doped AlGaN layer. The composition ratio of the p-type clad layer 38 is selected such that the molar fraction of AlN in the p-type clad layer 38 is lower than that of the electron block layer 36. The p-type clad layer 38 has a thickness of about 10 nm~1000 nm. For example, the p-type clad layer 38 has a thickness of about 400 nm~600 nm.

The p-side electrode 40 is formed on the p-type clad layer 38. The p-side electrode 40 is made of a material capable of establishing ohmic contact with the p-type clad layer 38. For example, the p-side electrode 40 is formed by a nickel (Ni)/gold (Au) stack structure.

The n-side electrode 42 is provided on the n-type clad layer 32. For example, the n-side electrode 42 is a Ti/Al-based electrode and is formed by, for example, a titanium (Ti)/Al/Ti/Au or Ti/Al/Ni/Au stack structure.

The coating part 60 is comprised of a plurality of isolated parts 60a distanced from each other. The isolated part 60a is made of a material having a refractive index lower than the refractive index of the substrate 22 forming the extraction surface 50a.

Generally, many of materials that form the light emitting part 50 for emitting ultraviolet light have a larger refractive index than air. Therefore, exposure the extraction surface 50a to air increases ultraviolet light that is internally reflected in the light emitting part 50 and reduces the efficiency of extracting light.

In the semiconductor light emitting device 100 according to this embodiment, the difference in refractive index at an interface between the extraction surface 50a and the coating part 60 is reduced and the efficiency of extracting light is increased. Since the coating part 60 is comprised of a plurality of isolated parts 60a distanced from each other, the residual stress inside each isolated part 60a is reduced accordingly. As a result, the tensile stress and compression stress produced at an interface between the extraction surface 50a and the coating part 60 is mitigated, and the occurrence of exfoliation and cracks of the coating part 60 at the interface is reduced.

Further, the semiconductor light emitting device 100 according to this embodiment is configured such that the plurality of isolated parts 60a are arranged in a dot pattern. This allows the isolated parts 60a to be arranged in a systematically distributed pattern. The shape of the isolated part 60a is not limited to a semispherical shape (circular in a top view) shown in FIG. 2.

Figure 3A:
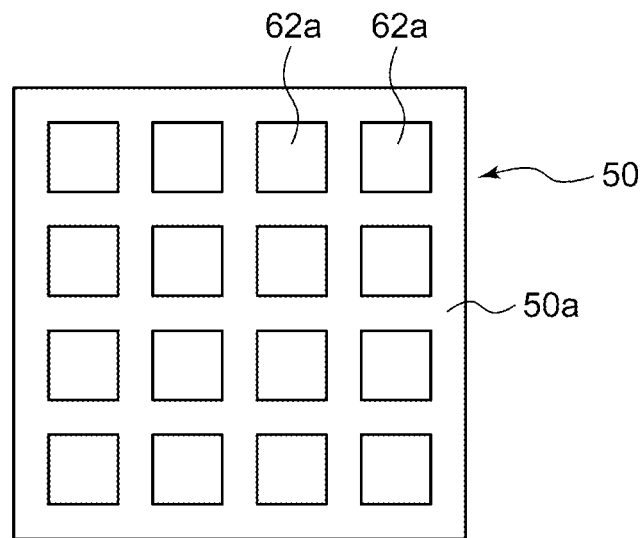
FIG. 3A-3B schematically show variations of isolated parts on the light emitting part.
Figure 3B:
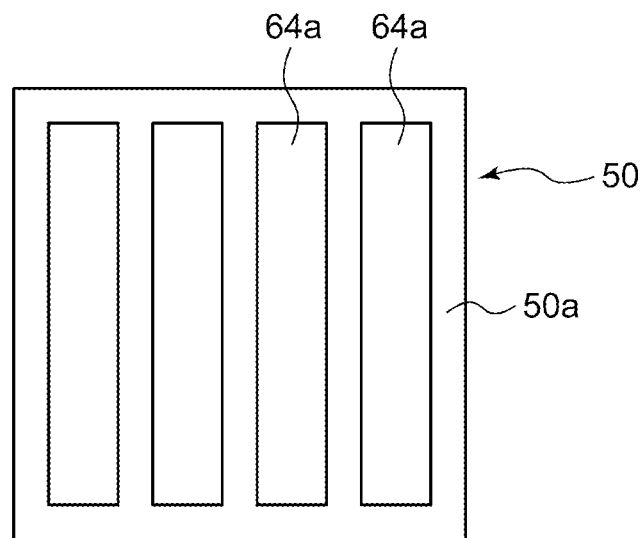

FIG. 3A-3B schematically show variations of isolated parts on the light emitting part. An isolated part 62a shown in FIG. 3A is a square and is formed on the extraction surface 50a at a position spaced apart from the adjacent isolated part 62a. An isolated part 64a shown in FIG. 3B is a rectangle and is formed on the extraction surface 50a a position spaced apart from the adjacent isolated part 64a.

Thus, the coating part 60 may be polygonal (e.g., square, hexagonal, etc.) isolated parts arranged in a distributed matrix pattern. Alternatively, a plurality of isolated parts that differ in the shape or size may be arranged in a distributed manner. The number and size of isolated parts in the coating part and the interval from the adjacent isolated part may be adopted from a variety of options. What is important is to reduce the magnitude of stress produced inside the isolated part by forming the coating part to be comprised a plurality of distributed isolated parts. The isolated part is not restricted to a particular shape or size so long as it can realize the goal.

A preferred embodiment of a configuration of the isolated part and the extraction surface will be illustrated below. The diameter or one side of the isolated part may be not less than 1 μm and not more than 100 μm. When the diameter or one side of the isolated part is not more than 100 μm, and, preferably, not more than 50 μm, and, more preferably, not more than 30 μm, the size of an individual isolated part will be sufficiently small with respect to the size of the extraction surface so that the residual stress produced inside the isolated part will be small.

Meanwhile, when the diameter or one side of the isolated part is not less than 1 μm, and, preferably, not less than 5 μm, and, more preferably, not less than 10 μm, the isolated part can be formed by a relatively simple method such as printing. Ink-jet printing, screen printing, imprinting, etc. may be used as a method of printing.

It is preferred that the percentage of the extraction surface 50a not coated with the coating part (isolated part) be about 10~90%. When the percentage of the extraction surface 50a not coated with the coating part is 10% or higher, and, preferably, 20% or higher, and, more preferably, 30% or higher, the efficiency of extraction is expected to be increased depending on the size of the coating part. Meanwhile, when the percentage of the extraction surface 50a not coated with the coating part is 90% or lower, and, preferably, 75% or lower, and, more preferably, 60% or lower, the size of the coating part will be smaller than the size of the extraction surface by a certain degree so that a sum of the residual stress produced inside the coating part is reduced.

A description will now be given of the material of the coating part (isolated part). The material of the coating part may be inorganic or resin so long as it has a refractive index lower than that of the material forming the extraction surface. Resin is preferable in view of the ease of formation. In particular, fluororesin or silicone-based resin is preferable in view of the durability against ultraviolet light.

Amorphous fully fluorinated resin having saturation binding only is more preferable. State otherwise, "having saturation binding only" means not substantially containing unsaturated binding. More specifically, CytopS from AGC Inc., Teflon (registered trademark) AF from Dupont, etc. may be used by way of example. Such a resin contains only saturation binding and is fully fluorinated and so has high binding energy. As such, it has excellent durability against high-energy light such as ultraviolet light (in particular, deep ultraviolet light). A resin like this has an amorphous nature and so has a high transmittance in a wide wavelength range including deep ultraviolet light. The transmittance of the coating part with respect to ultraviolet light is 80% or higher, and, preferably, 90% or higher. This realizes a highly efficient semiconductor light emitting device.

Figure 4:
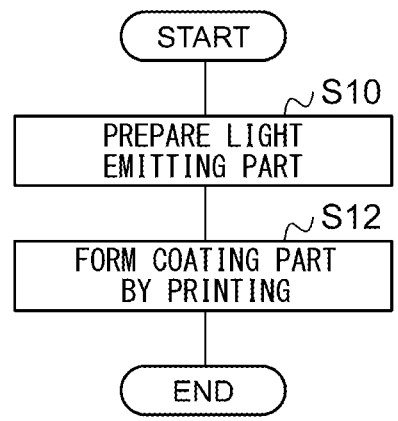
FIG. 4 is a flowchart showing a method of manufacturing the semiconductor light emitting device according to the embodiment.

A description will now be given of a manufacturing method for forming the coating part with a resin. FIG. 4 is a flowchart showing a method of manufacturing the semiconductor light emitting device according to the embodiment.

The method includes a step (S10) of preparing a light emitting part for emitting ultraviolet light and a step (S12) of forming a coating part by printing it on the light extraction surface of the light emitting part. This reduces at least a difference in refractive index between the extraction surface and the coating part and improves the efficiency of extracting light. Since the coating part is comprised of a plurality of mutually isolated parts distanced from each other, the residual stress inside each isolated part is reduced accordingly. As a result, the tensile stress and compression stress produced at an interface between the extraction surface and the coating part is mitigated, and a semiconductor light emitting device, in which the occurrence of exfoliation and cracks of the coating part at the interface is reduced, can be manufactured. The printing method may be adopted from a variety of options and may be selected in accordance with the shape and size of the isolated part.

The embodiments of the present invention are not limited to those described above and appropriate combinations or replacements of the features of the embodiments are also encompassed by the present invention. The embodiments may be modified by way of combinations, rearranging of the processing sequence, design changes, etc., based on the knowledge of a skilled person, and such modifications are also within the scope of the present invention.

What is claimed is:

1. A semiconductor light emitting device comprising:
    a light emitting part for emitting ultraviolet light; and
    a coating part that directly coats a part of an extraction surface from which the ultraviolet light emitted by the light emitting part is extracted, wherein
    the coating part consists of a plurality of isolated parts distanced from each other, and
    the isolated part is made of a second material having a refractive index that is lower than a refractive index of a substrate made of a first material forming the extraction surface,
    wherein a diameter or one side of the isolated part is not less than 1 μm and not more than 100 μm,
    the first material is a sapphire substrate or an aluminum nitride substrate,
    the second material is an amorphous fully fluorinated resin having saturation binding only, and
    a percentage of the extraction surface not coated with the coating part is 10~90%.

2. The semiconductor light emitting device according to claim 1, wherein
    the plurality of isolated parts are arranged in a dot pattern.

3. The semiconductor light emitting device according to claim 1, wherein
    the second material is a resin material having an ultraviolet transmittance of 80% or higher.

4. The semiconductor light emitting device according to claim 1, wherein
    the second material is a resin material having an ultraviolet transmittance of 80% or higher.

5. The semiconductor light emitting device according to claim 1, wherein the diameter or the one side of the isolated part is not less than 5 μm and not more than 50 μm.

6. The semiconductor light emitting device according to claim 1, wherein the diameter or the one side of the isolated part is not less than 10 μm and not more than 30 μm.

7. The semiconductor light emitting device according to claim 1, wherein the percentage of the extraction surface not coated with the coating part is 20-75%.

8. The semiconductor light emitting device according to claim 1, wherein the percentage of the extraction surface not coated with the coating part is 30-60%.

9. A method of manufacturing a semiconductor light emitting device comprising:
    preparing a light emitting part for emitting ultraviolet light; and
    printing a coating part directly on an extraction surface from which the ultraviolet light emitted by the light emitting part is extracted, wherein
    the coating part consists of a plurality of isolated parts distanced from each other,
    a diameter or one side of the isolated part is not less than 1 μm and not more than 100 μm,
    the isolated part is made of an amorphous fully fluorinated resin material having saturation binding only and having a refractive index that is lower than a refractive index of a substrate material forming the extraction surface,
    the substrate material is a sapphire substrate or an aluminum nitride substrate, and
    a percentage of the extraction surface not coated with the coating part is 10-90%.

* * * * *